United States Patent
Park et al.

(10) Patent No.: US 7,286,411 B2
(45) Date of Patent: Oct. 23, 2007

(54) ROW DECODER CIRCUIT FOR USE IN NON-VOLATILE MEMORY DEVICE

(75) Inventors: Jin-Sung Park, Gyeonggi-do (KR); Myong-Jae Kim, Gyeonggi-do (KR); Seung-Keun Lee, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 94 days.

(21) Appl. No.: 11/167,984

(22) Filed: Jun. 27, 2005

(65) Prior Publication Data

US 2006/0077717 A1  Apr. 13, 2006

(30) Foreign Application Priority Data

Oct. 7, 2004  (KR)  ...................... 10-2004-0080080

(51) Int. Cl.
  G11C 16/06  (2006.01)
  G11C 8/00   (2006.01)
  G11C 5/06   (2006.01)
(52) U.S. Cl. ............... 365/185.23; 365/72; 365/230.06
(58) Field of Classification Search ........... 365/185.23, 365/230.06
  See application file for complete search history.

(56) References Cited

U.S. PATENT DOCUMENTS 5,991,198 A    11/1999  Song et al.
6,088,267 A *  7/2000   Atsumi et al. ......... 365/185.23
2001/0053093 A1* 12/2001 Ogura et al. ........... 365/185.23
2001/0053094 A1* 12/2001 Otsuka .................. 365/185.23
2002/0172088 A1* 11/2002 Iorio et al. ............. 365/230.06

FOREIGN PATENT DOCUMENTS

KR  2000-0027296  5/2000
KR  2000-0039095  5/2002
KR  2004-0008516  1/2004
KR  2004-0015901  2/2004

OTHER PUBLICATIONS

English language abstract of Korean Publication No. 2000-0027296.
English language abstract of Korean Publication No. 2002-0039095.
English language abstract of Korean Publication No. 2004-0008516.
English language abstract of Korean Publication No. 2004-0015901.

* cited by examiner

*Primary Examiner*—Ly Duy Pham
(74) *Attorney, Agent, or Firm*—Marger Johnson & McCollom, P.C.

(57) ABSTRACT

The invention disclosed herein is a non-volatile memory device. The non-volatile memory device comprises: a first transistor connected between a first voltage and a control node, and controlled by a second voltage; a second transistor connected between the first voltage and the control node, and controlled by a third voltage, and a word line driver for driving a word line in responsive to a voltage of the control node. The second voltage is set to a ground voltage during an erase operation. The third voltage is set to a power voltage during the erase operation.

19 Claims, 4 Drawing Sheets

ROW DECODER CIRCUIT FOR USE IN NON-VOLATILE MEMORY DEVICE

CROSS REFERENCE TO RELATED APPLICATIONS

This application claims priority and benefit from Korean Patent Application No. 2004-80080 filed on Oct. 7, 2004, the contents of which is herein incorporated by reference in its entirety.

FIELD OF THE INVENTION

This invention generally relates to semiconductor memory devices and, more specifically, to a row decoder circuit for use in a non-volatile memory device.

BACKGROUND OF THE INVENTION

As is well known, memory cells arranged in a matrix format of rows and columns are provided in semiconductor memory devices. In order to write/read data to/from any memory cells, rows and columns should be selected. In other words, semiconductor memory devices should have a circuit for selecting rows (hereinafter referred to as "a row decoder circuit") and a circuit for selecting columns. The larger a memory capacity is, the greater the number of memory cells connected to a row/column. That is, now that a load of the row/column is increased, a time for driving the row/column leads to an increment of an access time. To overcome these problems, various techniques have been suggested recently. A typical example is a hierarchical row/column structure. A row decoder circuit with the hierarchical row/column structure is disclosed in Korean Laid-Open Publication No. 10-2004-0015901, which is hereby incorporated by reference.

FIG. 1 is a circuit diagram showing a row decoder circuit in a non-volatile memory device according to a conventional art. The decoder circuit of FIG. 1 is carried in the above-mentioned Korean Laid-Open Publication. The decoder circuit of FIG. 1 is a local decoder circuit corresponding to one global word line GWL. It will be clearly understood by those skilled in the art that local decoder circuits corresponding to the rest of the global word lines are constructed in the same manner. During an erase operation, the local decoder circuit of FIG. 1 is explained as follows.

An erase voltage of about −10V should be provided to word lines WL0-WLi during the erase operation. For this, while selection signals SS and GWL are maintained in a low level, Vpx, Vpgate, and Vex are set to 0V, −2V, and −10V, respectively. Under this bias condition, ND1 node is set to 0V by a PMOS transistor 11. These word lines WL0-WLi are respectively set to Vex, by NMOS transistors 12_0-12_i. That is, the word lines WL0-WLi are driven −10V, respectively during the erasing operation. Memory cells connected to the word lines WL0-WLi will be erased in well-known manner.

As previously mentioned, −2V Vpgate should be provided to the local decoder circuit 10 according to the conventional art during the erase operation. This means that a leased pump for generating −2V as well as a circuit for controlling the leased pump is required to non-volatile memory devices.

SUMMARY OF THE INVENTION

It is therefore an object of the invention to provide a row decoder in a non-volatile memory device capable of reducing chip area thereof.

In one aspect of the invention, there is provided a row decoder circuit in which comprises: a first transistor connected between a first voltage and a control node, and controlled by a second voltage; a second transistor connected between the first voltage and the control node, and controlled by a third voltage; and a word line driver for driving a word line in responsive to a voltage of the control node. The second voltage is set to a ground voltage during an erase operation, and the third voltage is set to a power voltage during the erase operation.

In this embodiment, the third voltage is set to the ground voltage during residual the erase operations except the erase.

In this embodiment, a switch for connecting the control node to one of the ground voltage and the power voltage in responsive to selection signals is further included during read/write operations.

In this embodiment, the first transistor is a PMOS transistor, and the second transistor is a NMOS transistor.

In this embodiment, the first voltage is set to a ground voltage, 10V, and 5V during the erase operation, the program operation, and the read operation, respectively.

In this embodiment, the second voltage is set to the ground voltage during the read operation. During the program operation, the second voltage is set to a voltage lower than the first voltage.

DETAILED DESCRIPTION OF THE PREFERRED EMBODIMENT

The invention will be described below with reference to the accompanying drawings, in which exemplary embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art.

Figure 2:
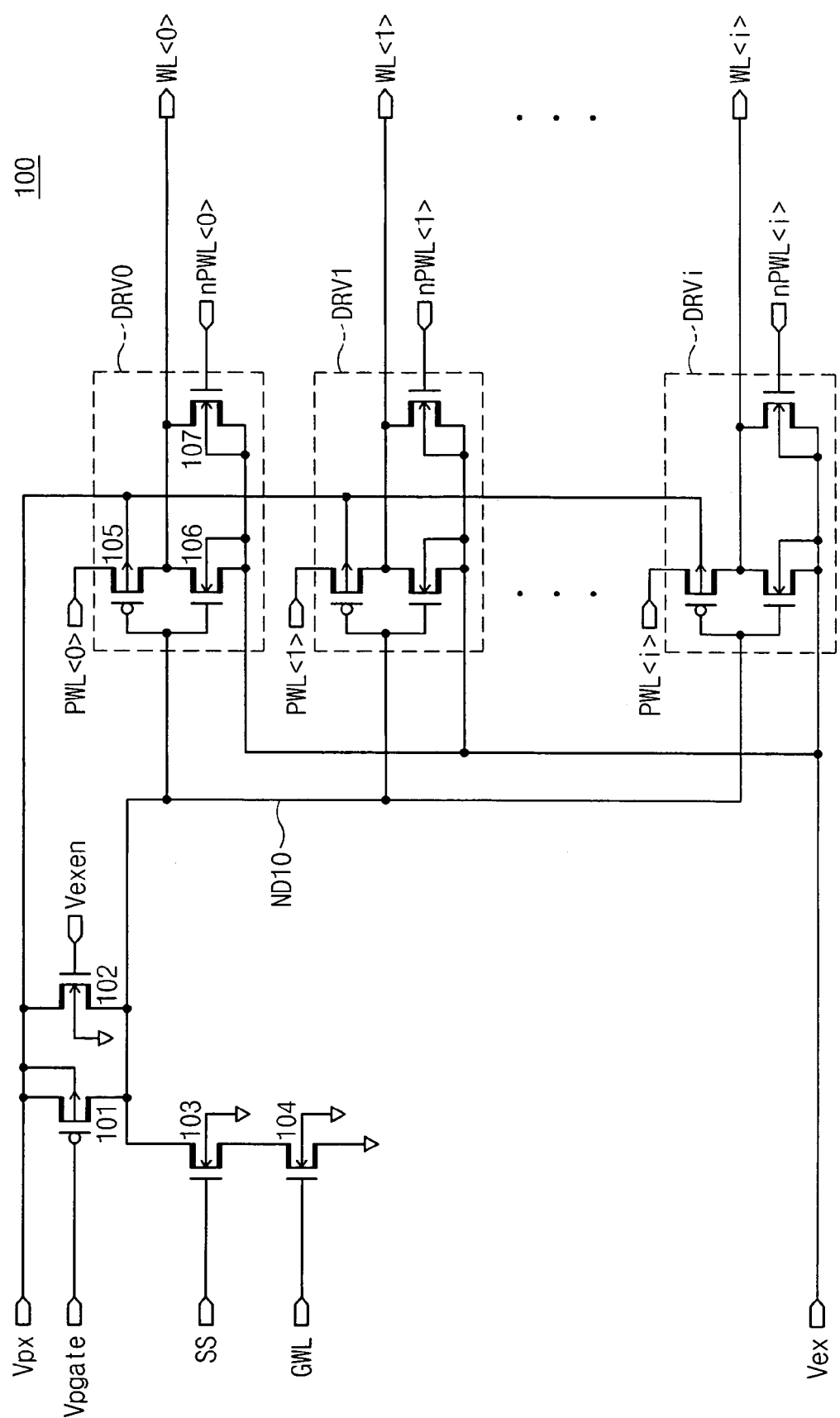
FIG. 2 is a circuit diagram showing the row decoder circuit of the non-volatile memory device according to a first embodiment of the invention.

FIG. 2 is a circuit diagram showing a row decoder circuit in a non-volatile memory device according to a first embodiment of the invention.

With reference to FIG. 2, the row decoder circuit 100 in the non-volatile memory device according to the first embodiment of the invention includes a PMOS transistor 101, NMOS transistors 102, 103, and 104, and a plurality of word line drivers DRV0-DRVi. The PMOS transistor 101 is connected between a Vpx voltage and a ND10 node as a control node, and controlled by Vexen. The NMOS transistors 103 and 104 are serially connected between the ND10 node and a ground voltage, and respectively controlled by selection signal SS and GWL. The word line driver DRV0 includes a PMOS transistor 105 and NMOS transistors 106 and 107. The PMOS transistor 105 is connected between a selection signal PWL0 and a word line WL0, and controlled by a voltage of the ND10 node. The NMOS transistor 106 is connected between the word line WL0 and the Vpx voltage, and controlled by an inversed selection signal nPWL0. Component elements of the rest of the word line drivers DRV1-DRVi is constructed in the same way of the driver DRV0 and is indicated by the same numeral reference.

In this embodiment, MOS transistors shown in FIG. 2 are constituted with a high-voltage transistor, which is well known in this field. The selection signal GWL is generated by a global decoder circuit (not shown) according to address information for selecting one of global lines. In accordance with a hierarchical row/column structure, one global word line corresponds to i number of word lines as shown in FIG. 2. The selection signal SS is generated by a sector selection circuit (not shown) according to address information for selecting sectors constituted with a bank. The selection signal PWL0-PWLi and nPWL0-NPWLi are generated by a sector selection circuit according to address information for selecting at least one among the word lines WL0-WLi.

A bias condition of the row decoder circuit according to each operation mode is as follows.

TABLE 1

|  | Erase | Program | Read |
| --- | --- | --- | --- |
| Vpx | 0 V | 10 V | 5 V |
| Vpgate | 0 V | −2 V | 0 V |
| Vexen | VCC | 0 V | 0 V |
| Vex | −10 V | 0 V | 0 V |

The operation of the row decoder circuit according to the first embodiment of the invention will be more fully described referring to FIG. 2 and TABLE 1.

Figure 1:
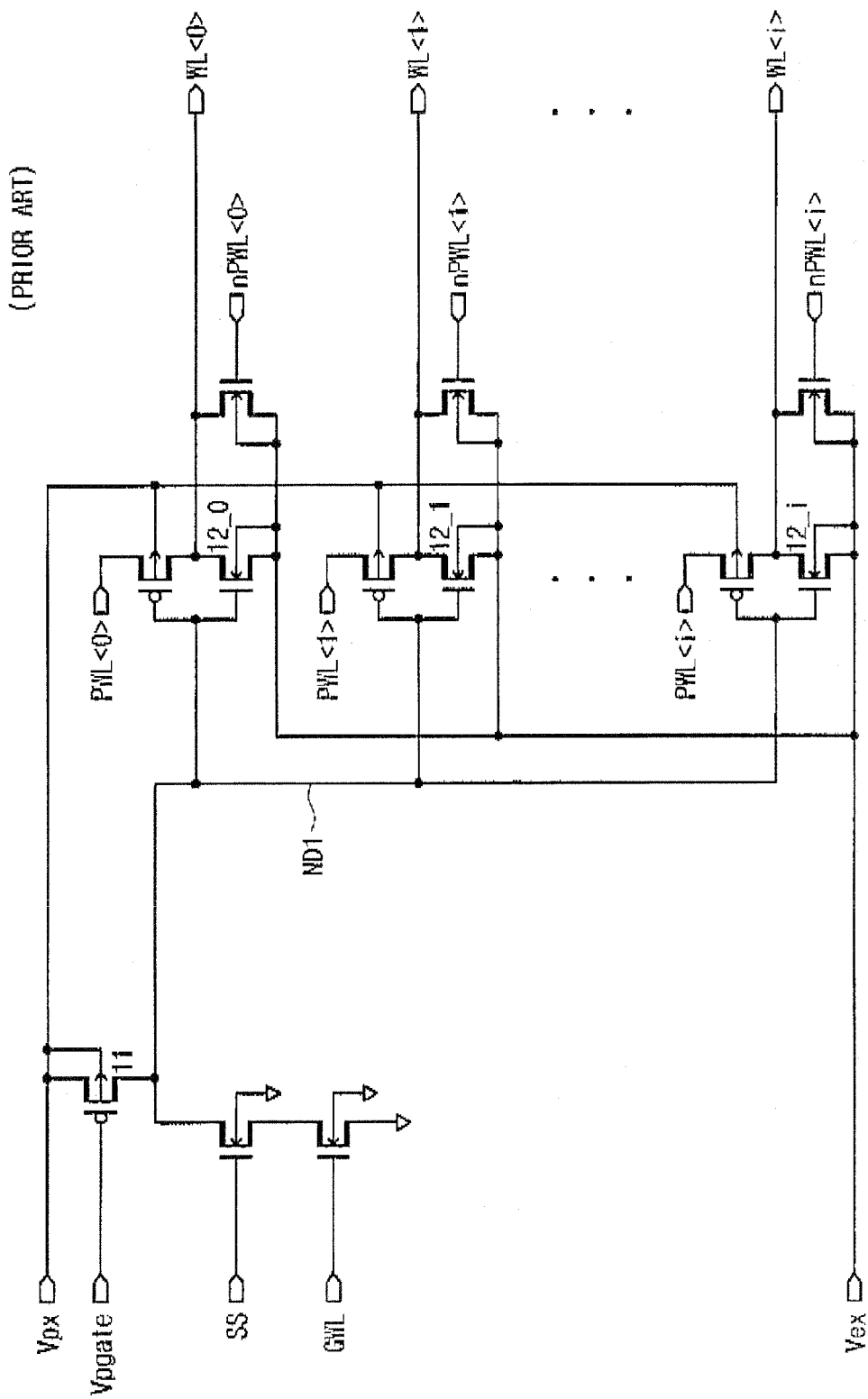
FIG. 1 is a circuit diagram showing a row decoder circuit of a non-volatile memory device according to a conventional art.

During the erase operation, as shown in TABLE 1, Vpx and Vpgate are set to 0V, and Vexen is set to a power voltage VCC, and Vex is set to −10V. Under this voltage condition, 0V, e.g., Vpx is applied to the ND10 node by the NMOS transistor 102 controlled by the Vexen regardless of the selection signals SS and GWL. As 0V is applied to the ND10 node, Vex, e.g., −10V is applied to the word line through the NMOS transistor 106 of each of the word line drivers DRV0-DRVi. Unlike a conventional row decoder, as shown in FIG. 1, Vpgate of 0V (not −2V) is applied to a gate of the PMOS transistor 101 during the erase operation. This means that there is no request of a leased pump for generating −2V and a circuit for controlling the leased pump. Thus, it is possible to remove the leased pump and the circuit for controlling the leased pump by only adding one NMOS transistor 102. As a result, the reduction of chip area is possible.

During the read/program operations, assumes that the selection signals SS, GWL, and PWL0 are activated. The activated selection signals SS and GWL have a high level of the power voltage VCC, and the activated selection signal PWL0 has Vpx. The inactivated selection signals PWL1-PWLi have a low level of a ground voltage. According to this bias condition, a ground voltage is applied through the NMOS transistors 103 and 104 to the ND10 node. A voltage of the selection signal PWL0, that is, Vpx (5V during the read operation and 10V during the program operation) is applied to the word lines WL0 by the PMOS transistor 105 of the word line driver DRV0. To the contrary, a ground voltage being Vex is applied to non-selected word lines WL1-WLi by the NMOS transistors 107 that are respectively controlled by inversed selection signals nPWL1-nPWLi.

Figure 3:
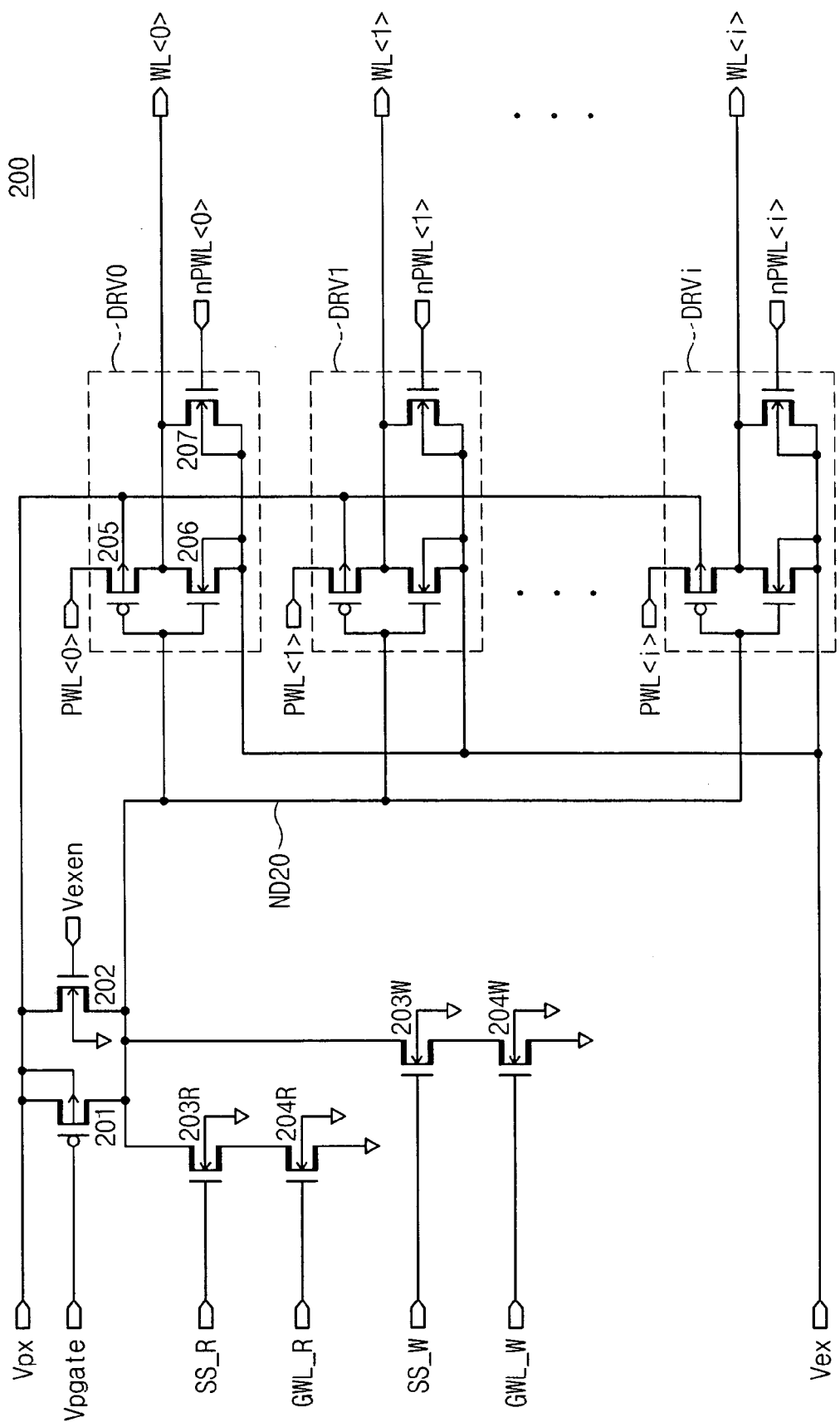
FIG. 3 is a circuit diagram showing the row decoder circuit of the non-volatile memory device according to a second embodiment of the invention.

FIG. 3 is a circuit diagram showing the row decoder circuit in the non-volatile memory device according to a second embodiment of the invention.

With reference to FIG. 3, the row decoder circuit 200 in the non-volatile memory device according to the second embodiment is different from the row decoder circuit shown in FIG. 2 in that a ND20 node is dependently controlled according to the read and program operations. A non-volatile memory device such as NOR flash device supports a RWW operation mode in which a write operation is performed during a read operation. The RWW operation mode is more fully described in the above-mentioned reference, and thus the description is omitted herein.

The row decoder circuit 200 in the non-volatile memory device according to the second embodiment of the invention includes a PMOS transistor 201, NMOS transistors 202, 203R, 203W, 204R, and 204W, and a plurality of word line drivers DRV0-DRVi. The PMOS transistor 201 is connected between the Vpx and the ND20 node, and controlled by Vpgate. The NMOS transistor 202 is connected between the Vpx and the ND20 node, and controlled by Vexen. The NMOS transistors 203R and 204R are serially connected between the ND20 node and a ground voltage, and controlled by selection signals SS_R and GWL_R. The NMOS transistors 203W and 204W are serially connected between the ND20 node and the ground voltage, and controlled by selection signals SS_W and GWL_W. The word line driver DRV0 includes the PMOS transistor 205 and NMOS transistors 206 and 207. The PMOS transistor 205 is connected between the selection signal PWL0 and the word line WL0, and controlled by a voltage of the ND20 node. The NMOS transistor 206 is connected between the word line WL0 and Vex, and controlled by the voltage of the ND20 node. The NMOS transistor 207 is connected between the word line WL0 and Vex, and controlled by the inversed selection signal nPWL0. Component elements of the rest of the word line drivers DRV1-DRVi is constructed in the same way of the driver DRV0 and is indicated by the same numeral reference.

Input voltages Vpx, Vpgate, Vexen, and Vex according to each operation mode are the same as those of TABLE 1. Hereinafter, the operation of the row decoder according to the second embodiment of the invention will be more fully described referring to FIG. 3 and TABLE 1.

During the erase operation, Vpx and Vpgate are set to 0V, and Vexen is set to the power voltage VCC, and Vex is set to −10V as shown in TABLE 1. Under this voltage condition, Vpx, that is, 0V is applied to the ND20 node by the NMOS transistor 202 controlled by Vexen voltage regardless of the selection signals SS_R, SS_W, GWLR, and GWL_W. As 0V is applied to the ND20 node, Vex (−10V) is applied to the word line by the NMOS transistor 206 of each of the word line drivers DRV0-DRVi. Unlike the row decoder circuit according to the conventional art, as shown in TABLE 1, Vpgate of 0V (not −2V) is applied to the gate of the PMOS transistor 201 during the erase operation. This means that there is no request of a leased pump for generating −2V and a circuit for controlling the leased pump. Accordingly, it is possible to remove the leased pump for generating −2V and the circuit for controlling the leased pump. As a result, it is possible to reduce chip area.

During the read operation, assumes that the selection signals SS_R, GWLR, and PWL0 are activated. The activated selection signals SS_R and GWL_R have a high level of a power voltage VCC, and the activated selection signal PWL0 has Vpx. Non-activated selection signals PWL1-PWLi have a low level of a ground voltage. Under this bias condition, a ground voltage is applied through NMOS transistors 203R and 204R to the ND20 node. During the read operation, NMOS transistors 203W and 204W become turned off by selection signals SS_W and GWL_W of low level. A voltage of the selection signal PWL0, that is, Vpx (5V) is applied to the word line WL0 by the PMOS transistor 205 of the word line driver DRV0. To the contrary, a ground voltage being Vex is applied to the non-selected word lines WL1-WLi by NMOS transistors 207, which are respectively controlled by inversed selection signals nPWL1-NPWLi.

During the program operation, assumes that selection signals SS_W, GWL_W, and PWL0 become activated. The activated selection signals SS_W and GWL_W have a high level of a power voltage VCC, and the activated selection signal PWL0 has Vpx. Non-activated selection signal PWL1-PWLi have a low level of a ground voltage. Under this bias condition, a ground voltage is applied to the ND20 node by the NMOS transistors 203W and 204W. During the program operation, the NMOS transistors 203R and 204R become turned off by the selection signals SS_R and GWL_R of a low level. A voltage of the selection signal PWL0, that is, Vpx (10V) is applied to the word line WL0 by the PMOS transistor 205 of the word line driver DRV0. To the contrary, a ground voltage being Vex is applied to the non-selected word lines WL1-WLi by the NMOS transistors 207, which are respectively controlled by inversed selection signals nPWL1-NPWLi.

Figure 4:
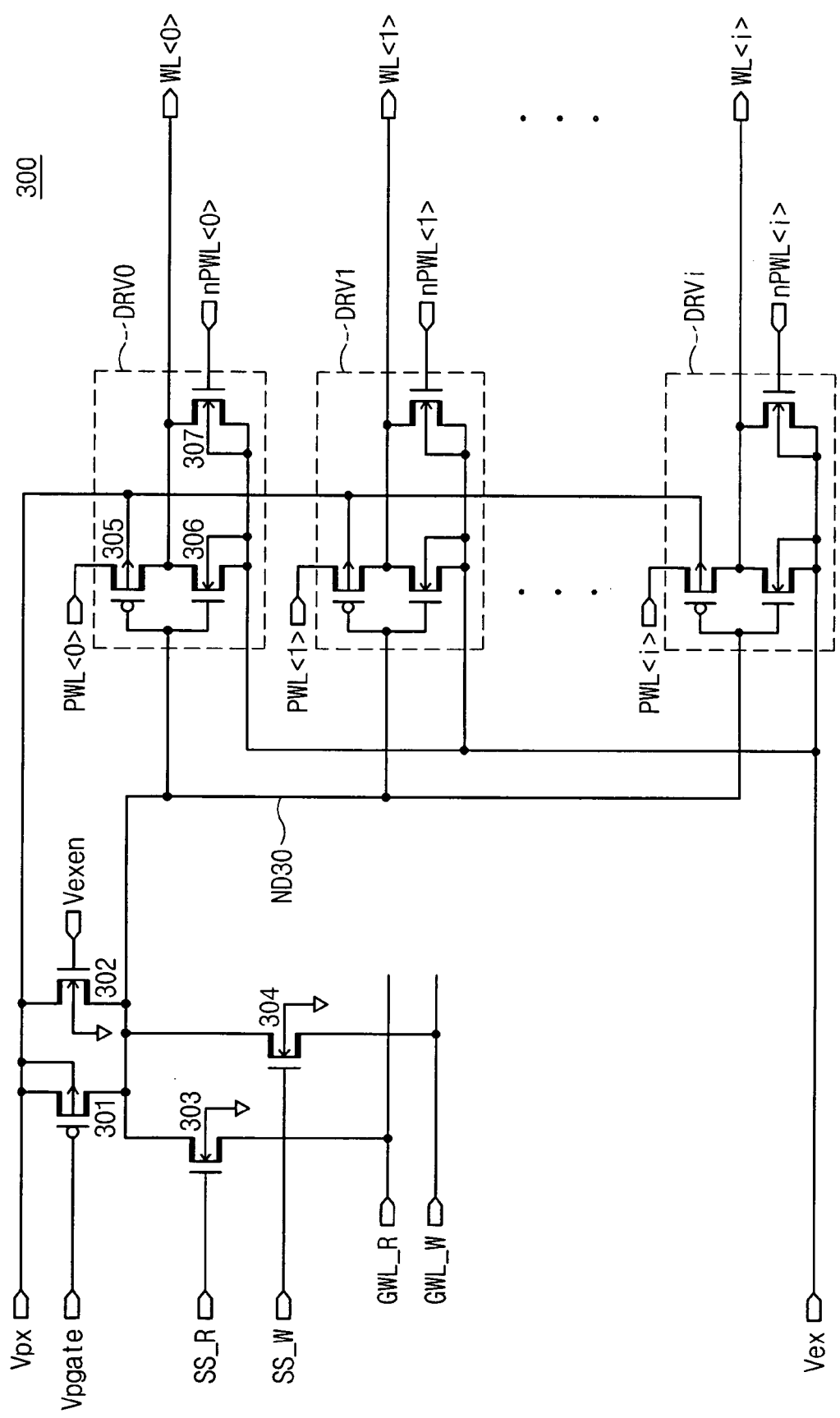
FIG. 4 is a circuit diagram showing the row decoder circuit of the non-volatile memory device according to a third embodiment of the invention.

FIG. 4 is a circuit diagram showing the row decoder circuit in the non-volatile memory device according to the third embodiment of the invention.

With reference to FIG. 4, the row decoder circuit 300 in the non-volatile memory device according to the second embodiment of the invention includes a PMOS transistor 301, NMOS transistors 302, 303, and 304, and a plurality of word line drivers DRV0-DRVi. The PMOS transistor 301 is connected between Vpx and ND30 node, and controlled by Vpgate. The NMOS transistor 302 is connected between Vpx and ND30 node, and controlled by Vexen. The NMOS transistor 303 is connected between the ND30 node and a selection signal line GWL_R, and controlled by the selection signal SS_R. The NMOS transistor 304 is connected between the ND30 node and the selection signal line GWL_W and controlled by the selection signal SS_W. The word line driver DRV0 includes a PMOS transistor 305 and NMOS transistors 306 and 307. The PMOS transistor 305 is connected between the selection signal PWL0 and the word line WL0, and controlled by a voltage of the ND30 node. The NMOS transistor 306 is connected between the word line WL0 and Vex, and controlled by the voltage of the ND30 node. The NMOS transistor 307 is connected between the word line WL0 and Vex, and controlled by an inversed selection signal nPWL0. Component elements of the rest of the word line drivers DRV1-DRVi is constructed in the same way of the driver DRV0 and is indicated by the same numeral reference.

Input voltages Vpx, Vpgate, Vexen, and Vex according to each operation mode are the same as those shown in TABLE 1. Hereinafter, the operation of the row decoder circuit according to the third embodiment of the invention will be more fully described referring to FIG. 4 and TABLE 1.

During the erase operation, as shown in TABLE 1, Vpx and Vpgate are set to 0V, and Vexen is set to a power voltage VCC, and Vex is set to −10V. Under this voltage condition, Vpx (0V) is applied to ND30 node by NMOS transistor 302 controlled by Vexen regardless of the selection signals SS_R, SS_W, GWL_R, and GWL_W. As 0V is applied to the ND30 node, Vex (−10V) is applied to a word line by the NMOS transistor 306 of each of the word line drivers DRV0-DRVi. Unlike the row decoder circuit according to the conventional art, as shown in TABLE 1, Vpgate of 0V (not −2V) is applied to the gate of the PMOS transistor 301 during the erase operation. This means that there is no request of a leased pump for generating −2V and a circuit for controlling the leased pump. Accordingly, it is possible to remove the leased pump for generating −2V and the circuit for controlling the leased pump. As a result, it is possible to reduce chip area.

During the read operation, assumes that selection signals SS_R, GWL_R, and PWL0 are activated. The activated selection signals SS_R and GWL_R have a high level of a power voltage VCC and a low level of a ground voltage, respectively. The activated selection signal PWL0 has Vpx. Non-activated selection signals PWL1-PWLi have a low level of a ground voltage. Under this bias condition, the ND30 node is connected to the selection signal line GWL_R having a ground voltage. During the read operation, the NMOS transistor 304 becomes turned off by the selection signal SS_W of a low level. A voltage of the selection signal PWL0, that is, Vpx (5V) is applied to the word line WL0 by the PMOS transistor 305 of the word line driver DRV0. To the contrary, a ground voltage being Vex is applied to the non-selected word lines WL1-WLi by the NMOS transistors 307 that are respectively controlled by inversed selection signals nPWL1-NPWLi.

During the program operation, assumes that selection signals SS_W, GWL_W, and PWL0 become activated. The activated selection signals SS_W and GWL_W have a high level of a power voltage VCC and a low level of a ground voltage, respectively. The activated selection signal PWL0 has Vpx. Non-activated selection signals PWL1-PWLi have a low level of a ground voltage. Under this bias condition, the ND30 node is connected to the selection signal line GWL_W having a ground voltage by the NMOS transistor 304. During the program operation, the NMOS transistor 303 becomes turned off by the selection signal SS_R of a low level. A voltage of the selection signal PWL0 being Vpx (10V) is applied to the word line through the PMOS transistor 305 of the word line driver DRV0. To the contrary, a ground voltage being Vex is applied to non-selected word lines WL1-WLi by the NMOS transistors 307, which are respectively controlled by inversed selection signals nPWL1-NPWLi.

As previously mentioned, a leased pump for generating −2V used during an erase operation and a circuit for controlling the leased pump are removed, thereby reducing chip area.

Having described exemplary embodiments of the invention, it is noted that modifications and variations can be made by persons skilled in the art in light of the above teachings. Therefore, it is to be understood that changes may be made to embodiments of the invention disclosed that are nevertheless still within the scope and the spirit of the invention as defined by the appended claims.

What is claimed is:

1. A row decoder circuit for use in a non-volatile memory device capable of operating in read, program, and erase modes, comprising:

a first transistor connected between a first voltage and a control node, and controlled by a second voltage;

a second transistor connected between the first voltage and the control node, and controlled by a third voltage; and a word line driver for driving a word line responsive to a voltage of the control node, wherein during an erase operation, the second voltage is set to a ground voltage and the third voltage is set to a power voltage.

2. The row decoder circuit of claim 1, wherein the third voltage is set to the ground voltage during residual operations except the erase operation.

3. The row decoder circuit of claim 1, further comprising a switch for connecting the control node to one of the ground voltage and the power voltage responsive to selection signals during read and program operations.

4. The row decoder circuit of claim 3, wherein the switch comprises a first switch transistor connected in series with a second switch transistor.

5. The row decoder circuit of claim 1, wherein the first transistor is a PMOS transistor, and the second transistor is a NMOS transistor.

6. The row decoder circuit of claim 1, wherein the first voltage is set to a ground voltage, 10V, and 5V during the erase operation, the program operation, and the read operation, respectively.

7. The row decoder circuit of claim 1, wherein the second voltage is set to a ground voltage during the read operation, and wherein the second voltage is set to a voltage lower than the first voltage during the program operation.

8. A method of operating a row decoder circuit for use in a non-volatile memory device, comprising:

controlling a first transistor, the first transistor connected between a first voltage and a control node, by a second voltage;

controlling a second transistor, the second connected between the first voltage and the control node, by a third voltage;

driving a word line responsive to a voltage of the control node;

setting the second voltage to a ground voltage during a read operation; and setting the second voltage to a voltage lower than the first voltage during a program operation.

9. The method of claim 8, during an erase operation, comprising:

setting the second voltage to a ground voltage; and
setting the third voltage to a power voltage.

10. The method of claim 8, during read and program operations, comprising:

connecting the control node to one of the ground voltage and the power voltage responsive to selection signals.

11. The method of claim 8, comprising:

setting the third voltage to the ground voltage during residual operations except the erase operation.

12. The method of claim 8, comprising setting the first voltage to a ground voltage, 10V, and 5V during an erase operation, a program operation, and a read operation, respectively.

13. A row decoder circuit for use in a non-volatile memory device capable of operating in read, program, and erase modes, comprising:

a first PMOS transistor connected between a first voltage and a control node, and controlled by a second voltage;

a second NMOS transistor connected between the first voltage and the control node, and controlled by a third voltage; and a word line driver for driving a word line responsive to a voltage of the control node.

14. The row decoder circuit of claim 13, wherein during an erase operation, the second voltage is set to a ground voltage and the third voltage is set to a power voltage.

15. The row decoder circuit of claim 13, wherein the third voltage is set to the ground voltage during residual operations except the erase operation.

16. The row decoder circuit of claim 13, further comprising a switch for connecting the control node to one of the ground voltage and the power voltage responsive to selection signals during read and program operations.

17. The row decoder circuit of claim 16, wherein the switch comprises a first switch transistor connected in series with a second switch transistor.

18. The row decoder circuit of claim 13, wherein the first voltage is set to a ground voltage, 10V, and 5V during the erase operation, the program operation, and the read operation, respectively.

19. The row decoder circuit of claim 13, wherein the second voltage is set to a ground voltage during the read operation, and wherein the second voltage is set to a voltage lower than the first voltage during the program operation.

* * * * *